US006859077B1

(12) United States Patent
Huang et al.

(10) Patent No.: US 6,859,077 B1
(45) Date of Patent: Feb. 22, 2005

(54) STARTUP CIRCUIT FOR ANALOG INTEGRATED CIRCUIT APPLICATIONS

(75) Inventors: Shengming Huang, Gourock (GB); Andre Schouten, Inverkip (GB)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/648,498

(22) Filed: Aug. 25, 2003

(51) Int. Cl.[7] .................................................. H03L 7/00
(52) U.S. Cl. ........................................ 327/143; 327/539
(58) Field of Search ................................ 327/142, 143, 327/198, 530, 534, 535, 537, 538, 539, 543

(56) References Cited

U.S. PATENT DOCUMENTS 6,356,064 B1 * 3/2002 Tonda ........................ 323/313
6,515,524 B1 * 2/2003 Sterrantino et al. .......... 327/143

* cited by examiner

*Primary Examiner*—Jeffrey Zweizig

(57) ABSTRACT

A startup circuit is used for producing a startup current for an analog integrated circuit device. The startup circuit includes a first portion including a diode component and a capacitance component. The first portion is configured to function as a power supply backup and generate a backup point voltage. The startup circuit includes a second portion including a current mirror component and a feedback component. The second portion is configured to generate a startup current using the backup point voltage, such that the startup current is provided based on the backup point voltage as a power supply voltage increases from a power off condition or a transient, thereby keeping an analog circuit alive during transients in power supply for fast recover and operation.

22 Claims, 5 Drawing Sheets

STARTUP CIRCUIT FOR ANALOG INTEGRATED CIRCUIT APPLICATIONS

TECHNICAL FIELD

The present invention relates to the field of low-power integrated circuits. More particularly, the present invention relates to a low-power startup circuit for use in analog integrated circuit applications.

BACKGROUND ART

Within the communications industry, there is an ever increasing need for higher performance portable devices having long battery lives. For example, handheld personal information devices (e.g., palmtop computers), cell phones, pagers, and the like, are processing data at faster rates, performing more sophisticated functions, and storing larger amounts of data, while simultaneously functioning for increased periods of time on internal battery power. For example, it is not uncommon for modern cell phone devices to operate continuously in standby mode for several days on end.

Low-power integrated circuits are critical to extend functioning on internal battery power for such handheld devices. To extend battery life, many handheld devices are designed to enter a standby mode when there full functionality is not required by the user. For example, a cell phone is designed to enter a standby mode when it is not being used in a voice conversation. The cell phone can “wake up” from standby when a call is received or when the user desires to place a new call. Similarly, many personal information devices are designed to enter standby mode after some duration of non-use from the user, and wake up when the user activates some function, accesses some data (e.g., clicks a GUI icon) etc. While in standby mode, modern battery power devices are designed to require minimal amounts of power, thereby extending their battery lives.

Well-designed standby mechanisms can greatly extend the functional life of a portable battery powered device. Many standby mechanisms function by turning off one or more circuit blocks of the device to save power during periods of nonuse, and subsequently restarting the one or more blocks when the device returns to operational mode. Accordingly, the design of integrated circuits that implement standby modes, turning off blocks and later turning on those blocks for full functionality, is an area of great interest to the electronics industry. It is important that those mechanisms which turn off and subsequently turn on circuit blocks draw minimal amounts of current. Additionally, is important that such mechanisms reliably wake up the device upon some external event, such as, in the case of a cell phone, receiving an incoming phone call.

Devices are also required to reliably power up from an off state, or unpowered state, in addition to waking up from a standby mode. When a device is initially powered up, it is important that the first voltages applied to energize the elements of the device are stable and orderly. For example, voltage transients, voltage spikes, and the like, can cause different circuit elements to power on out of order from one another, leading to problems. Such transients can be especially difficult for an analog circuit. Analog circuits can be more vulnerable to current and/or voltage transients than digital circuits. Hence, it is desirable that the startup mechanism to wake up from an off state or standby mode function reliably in the presence of noise or other disturbances on the power supply, and provide a smooth predictable startup current/voltage to reliably wake up the device.

Specific circuits have been designed to ensure the overall device reliably starts up from an off state (or standby mode). Such circuits are referred to as startup circuits. Startup circuits are used in powering up devices from a power off condition in addition to waking up devices from sleep modes.

Thus, what is required is a startup circuit which maintains a more constant, non-varying startup current over a range of power supply voltage level, in comparison to the prior art. What is required is a startup circuit having very low static power consumption. Additionally, what is required is a startup circuit that will reliably produce the required amount of startup current in order to reliably power up or wake up an integrated circuit. The present invention provides a novel solution to the above requirements.

SUMMARY OF THE INVENTION

Embodiments of the present invention comprise a startup circuit for analog integrated circuit applications. Embodiments of the present invention provide a startup circuit which maintains a more constant, non-varying startup current over a range of power supply voltage level. Embodiments of the present invention have minimal static power consumption. Additionally, embodiments of the present invention reliably produce the required amount of startup current in order to reliably power up or wake up an integrated circuit.

In one embodiment, the present invention is implemented as a startup circuit for producing a startup current for an analog integrated circuit device. The startup circuit includes a first portion including a diode component and a capacitance component. The first portion is configured to function as a power supply backup and generate a backup point voltage. The startup circuit includes a second portion including a current mirror component and a feedback component. The second portion is configured to generate a startup current using the backup point voltage, such that the startup current is provided based on the backup point voltage as a power supply voltage increases from power off or drops transiently, thereby keeping an analog circuit alive during transients in the power supply for fast recover and operation.

BRIEF DESCRIPTION OF THE DRAWINGS

The present invention is illustrated by way of example and not by way of limitation, in the Figures of the accompanying drawings and in which like reference numerals refer to similar elements and in which.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be understood by one of ordinary skill in the art that the present invention may be practiced without these specific details. In other instances, well known methods, procedures, components, and circuits have not been described in detail as not to unnecessarily obscure aspects of the present invention.

Embodiments of the present invention comprise a startup circuit for analog integrated circuit applications. Embodiments of the present invention provide a startup circuit which maintains a more constant, non-varying startup current over a range of power supply voltage level. Embodiments of the present invention have minimal static power consumption. Additionally, embodiments of the present invention reliably produce the required amount of startup current in order to reliably power up or wake up an integrated circuit. The present invention and its benefits are further described below.

Figure 1:
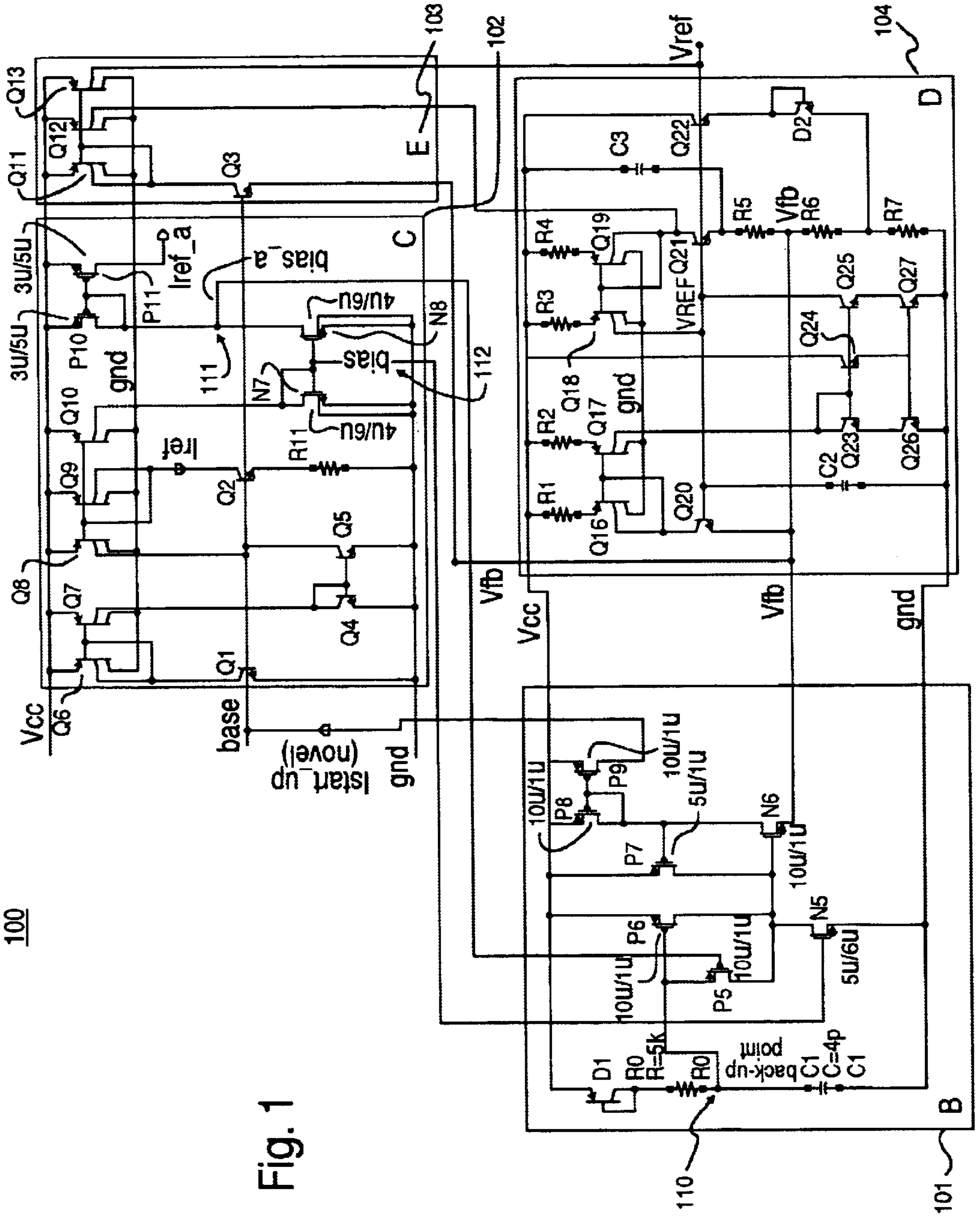
FIG. 1 shows a diagram of a system in accordance with one embodiment of the present invention.

FIG. 1 shows a diagram of a system 100 in accordance with one embodiment of the present invention. As shown in FIG. 1, system 100 includes four blocks; block B 101, block C 102, block D 104, and block E, 103.

In the system 100 embodiment, block B 101 shows a startup circuit in accordance with one embodiment of the present invention. Block C 102 is a current reference circuit and block D 104 is a voltage reference circuit. Block E 103 is a startup circuit for starting-up the voltage reference circuit.

As shown in Block B 101 of FIG. 1, the startup circuit of the present embodiment has two portions. The first portion includes diode component D1 and capacitance component C1. The diode D1 and capacitance C1 are configured to act as a back-up power supply. In the present embodiment, the diode D1 is the smallest area PNP transistor with diode connection. In the present embodiment, the capacitance C1 is set to be 3 or 4 pF. It should be noted that this capacitance value can be higher or lower. The value of C1 is not critical since no static current is needed from it (e.g., capacitor C1 prevents static current flow).

In the startup circuit of the present embodiment, to reduce the transient stress on capacitor C1, a resistor R0 (e.g., 5 k resistor) is placed between D1 and C1. As the power supply Vcc starts to rise from 0 volts, the voltage level (e.g., at a initial 0 V) at a back-up point 110 does not increase until power supply rises to a level above the forward turn-on voltage Vd of diode D1. Beyond this point, C1 is charged via D1 to a level of (Vcc−Vd).

The second portion of the startup circuit of the present embodiment includes transistors P5–P9 and transistors N5–N6. In the present embodiment, the gate of transistor N5 is connected to the gate of transistor N7, as shown by node 112 (bias). The gate of P5 is connected to drain/gate of P10 and P11, as shown by node 111 (bias_a).

In the present embodiment, Vbias_a (e.g., the voltage at node 111) follows Vcc and with a Vtp (threshold voltage of transistor P10) lower than Vcc. The source of transistor P5 is connected to the back-up point 110 rather than Vcc. The gate of transistor P6 is also connected to back-up point 110. The gate of transistor P7 is connected to the drain of transistor N6 so that N6 and P7 form a positive feedback network. In the present embodiment, (e.g., as illustrated in FIG. 1) the source of N6 is shown connected to Vfb. It should be noted that the source of transistor N6 can be connected to either Vfb or ground. The transistors P8 and P9 constitute a current mirror for providing the startup current (Istart_up) to block C 102 (e.g., the current reference circuit).

Thus, the startup circuit of the system 100 embodiment comprises an essential part of a reference circuit used in, for example, a large number of analog circuit applications. The startup circuit of the present invention generates a startup current for a bandgap current reference circuit (e.g., the current reference circuit in block C 102) at a lower supply voltage compared to conventional prior art startup circuits. This is a desirable attribute in, for example, low voltage applications, where power consumption must be very low.

The startup circuit of the system 100 embodiment can also generate a restartup current immediately whenever there is a transient drop (e.g., down to below 1.0 V) in the power supply Vcc. This aspect is necessary but not available for prior art conventional startup circuits. This aspect keeps a current reference circuit alive during transients, for example, to facilitate fast recovery and operation of the device. Additionally, the startup circuit of the system 100 embodiment provides advantages of a soft startup capability and low power consumption.

Figure 2:
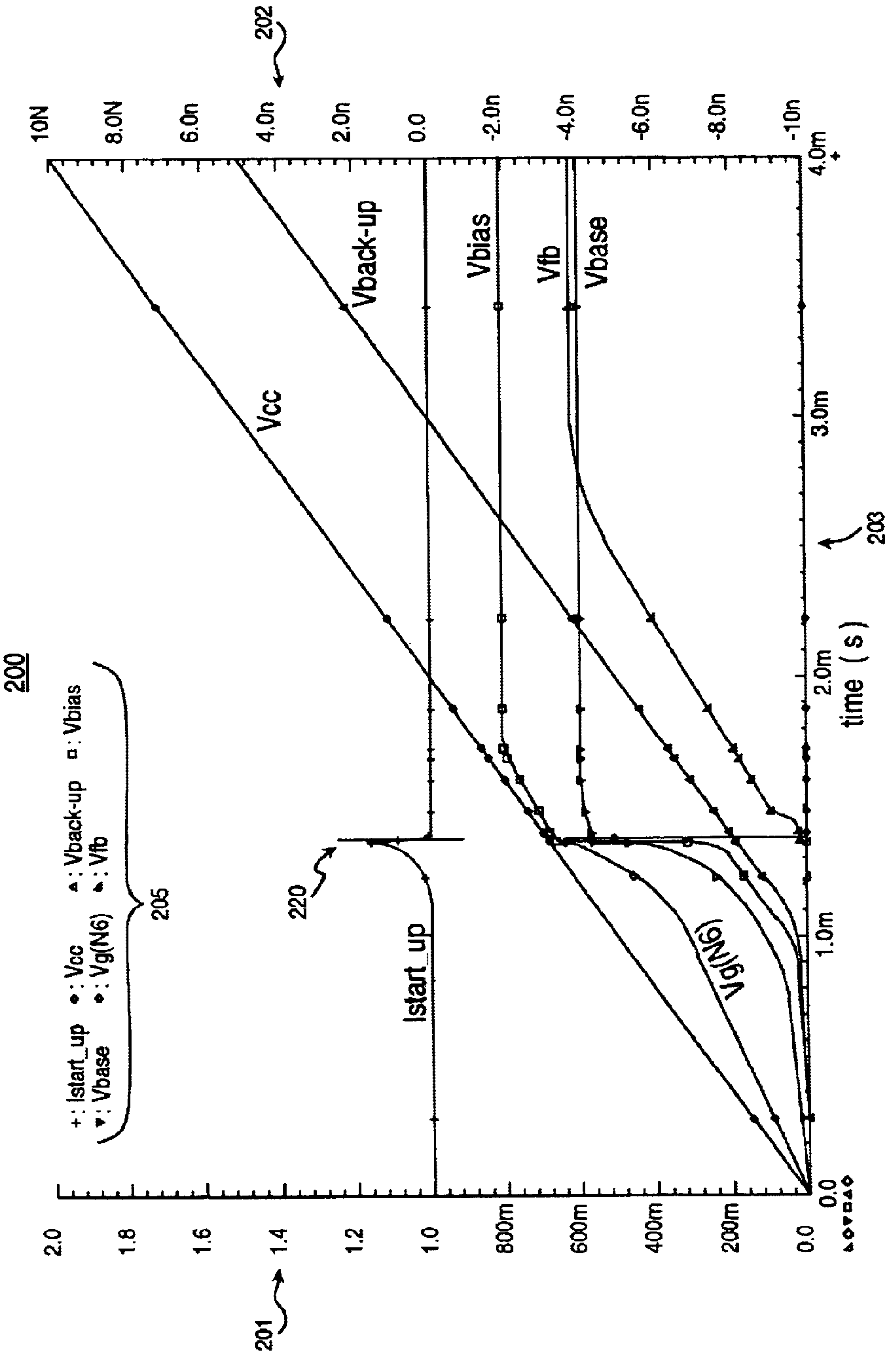
FIG. 2 shows a diagram depicting the generation of the startup current as the power supply Vcc increases from 0 volts in accordance with one embodiment of the present invention.

FIG. 2 shows a diagram 200 depicting the generation of the startup current as the power supply Vcc increases from 0 volts. As shown in diagram 200, the vertical axis 201 shows the voltage for each of the voltage variables 205 depicted on the diagram (e.g., Vcc, Vfb, Vbase, Vg(N6), Vback-up, and Vbias). The vertical axis 202 shows the current of Istart_up only. The horizontal axis 203 shows time. The variables 205 are as depicted in FIG. 1. For example, Vbase is the voltage at base of Q1 and Q2 of block C 102, Vbias is the voltage at the bias point 112 (gate of N7 and N8), Vg(N6) is the gate voltage of transistor N6 of FIG. 1, Vback-up is the voltage at the backup point 110, Istart_up is the drain current of transistor P9, and Vfb is the voltage at the emitter of transistor Q20 of block D 104. Diagram 200 is described with reference to circuit elements of system 100 of FIG. 1.

Referring to FIG. 2, initially, before Vcc rises to over the forward turn-on voltage Vd of diode D1 (Vcc rises at a rate of 1V/2 ms), the voltage at back-up point 110 is nearly zero and Vbias at the gate of transistor N7 is lower than the threshold voltage of N5. Vfb in the voltage reference circuit is also nearly zero. Therefore transistor N5 is in the off-state and transistor P6 operates in the weak on-state with increasing Vcc (since the Vgs of transistor P6 equals −Vcc(t) in this stage and P6 tends to turn-on as Vcc rises), causing transistor N6 to operate in the weak on-state. Then transistor P7 accelerates the full turn-on of transistor N6, and transistors P8–P9 provide the startup current (e.g., the drain current of P9) for the base of the transistors Q1 and Q2 in the current reference circuit.

Referring still to FIG. 2, the current reference circuit (e.g., block C 102) then starts to function and Vbias (e.g., gate of transistor N7) starts to increase. Since the width-to-length ratio (W/L) of transistor N5 is larger than that of transistor N7, N5 turns-on once Vbias is built up. The gate-source voltage Vgs of transistor P6 equals −Vd after Vback-up starts to rise, which is higher than Vtp of transistor P6. Thus, transistor P6 still operates in the weak off-state (nearly on). Also, the Vgs of transistor P5 is equal to Vd−|Vtp(P10)|, significantly higher than Vtp of transistor P5, so that P5 operates in the off-state.

Therefore, once transistor N5 turns on, the gate voltage of transistor N6 will be low enough to turn off N6 and thus the startup current from transistor P9. Again, transistor P7 accelerates the turn-off of transistor N6 in this stage. As shown in diagram 200, it is clear that there is no static current flowing through the startup circuit under normal operation (e.g., after the Istart_up current flow indicated by line 220). In addition, in contrast to a conventional prior art startup circuit, it is not necessary to connect the source of N6 to Vfb for switching off transistor N6 and thus transistor P9. The source of transistor N6 can also be connected to ground. In such a case, the W/L of transistor N5 needs to be increased and the W/L of transistor N6 decreased.

Figure 3:
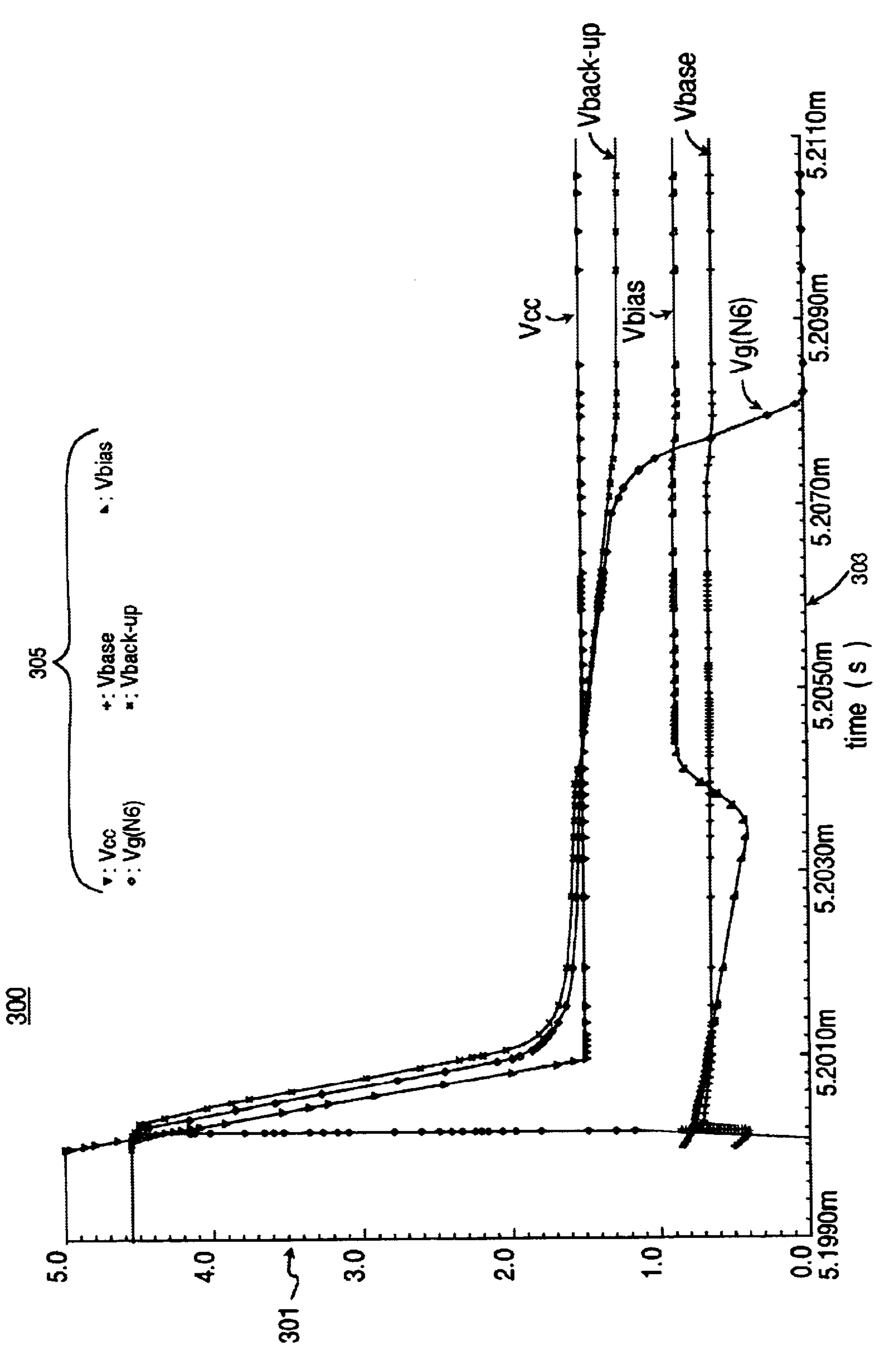
FIG. 3 shows a diagram illustrating the response of the startup system when there is a large transient drop in power supply in accordance with one embodiment of the present invention.

Referring now to FIG. 3, diagram 300 shows the response of the system 100 when there is a big transient drop in power supply (e.g., from Vcc(0) down to Vcc(t)) in accordance with one embodiment of the present invention. The vertical axis 301 is the voltage for the all of the variables 305. The horizontal axis 303 is the time axis for the variables 305. Diagram 300 is described with continuing reference to system 100 of FIG. 1.

Whenever there is a big transient drop in power supply, the reference current Iref (the collector current of Q2) collapses and Vbase drops. As shown in diagram 300, the bias voltage (Vbias) at the gate of N7 and N8 also drops due to collapsed current from transistor Q10, leading to the turn-off of transistor N5. At the same time, the gate voltage (Vbias_a) of P5 also falls (down to Vcc(t)−|Vtp(P10)|). On the other hand, the source of P5 is kept at the back-up point voltage Vback-up, which is equal to Vcc(0)−Vd for a short period of time. During this period, transistor P5 turns on, charging the gate of transistor N6 to a high voltage level from zero and resulting in a full turn-on of transistor N6. Therefore, a restartup current is generated from transistor P9 to the base of transistor Q1. Once Vbias is built up again, transistor N5 turns on. At the same time, Vback-up falls due to the discharging to gate of transistor N5 and through transistor N5 to ground. Thus transistor P5 tends to be turned off, causing transistors N6 and P9 to turn off again.

Figure 4:
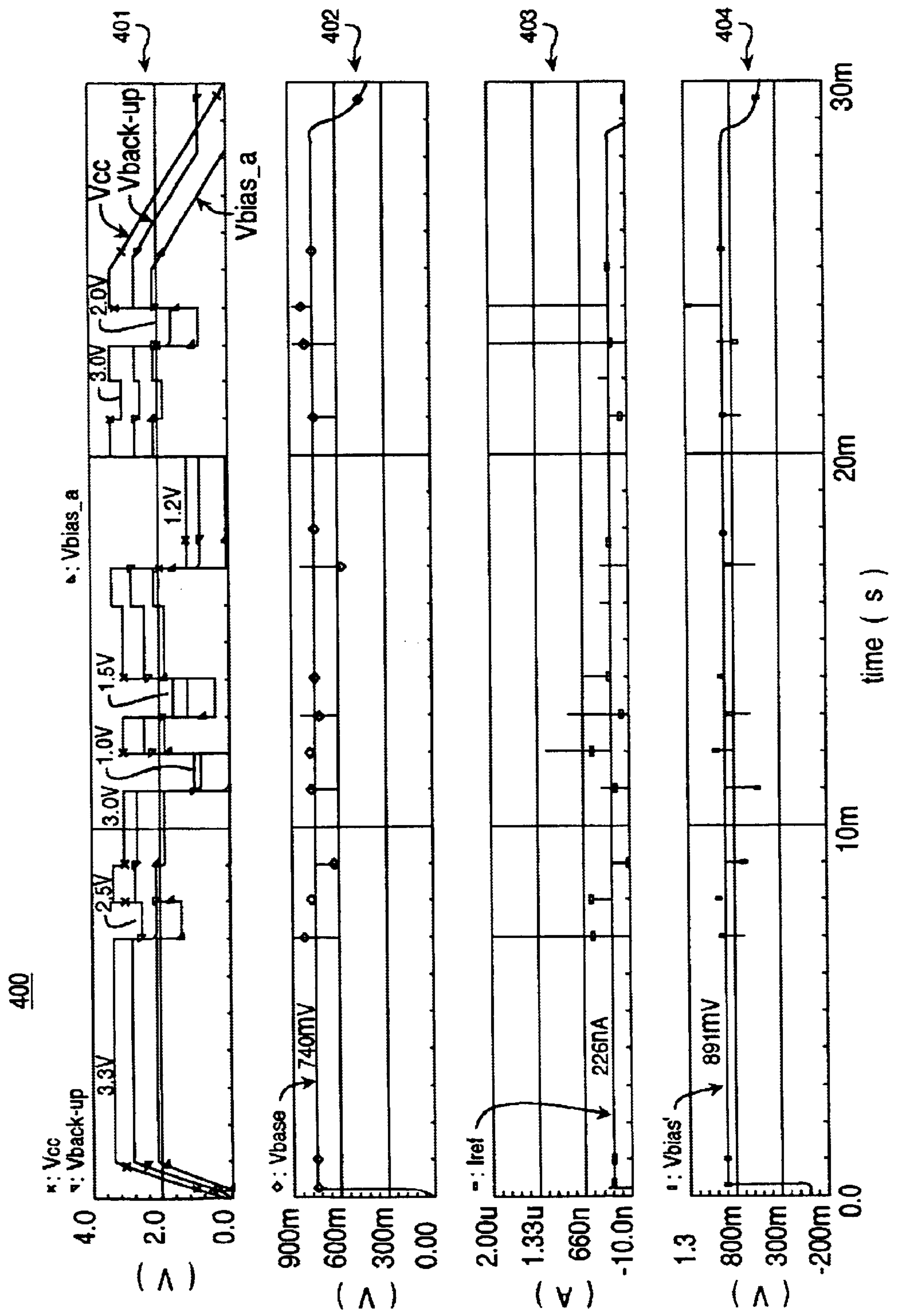
FIG. 4 shows a diagram depicting the operation of a startup system in accordance with one embodiment of the present invention in the presence of transient drops in the power supply voltage.

FIG. 4 shows a diagram 400 depicting the operation of a startup system 100 in accordance with one embodiment of the present invention in the presence of transient drops in the power supply voltage.

As described above, in the system 100 embodiment, the source of transistor N5 can be connected to either Vfb or ground. FIG. 4 shows a case where the source of transistor N6 is connected to Vfb. FIG. 4 shows four graphs 401–404 depicting the behavior of the signals Vcc, Vback-up, Vbias_a, Vbase, Iref, and Vbias, as shown. In each of the graphs 401–404, the horizontal axis is time (sec) and the vertical axis of 401, 402 and 404 is voltage. The vertical axis of 403 is current. The period time shown on each of the horizontal axes is common. The voltage range on the vertical axes is different for each of the graphs 401, 402 and 404, as shown. FIG. 4 shows benefits of the system 100 embodiment of present invention in that the signals Iref, Vbase, and Vbias can be recovered immediately whenever there is a big transient drop in Vcc.

Figure 5:
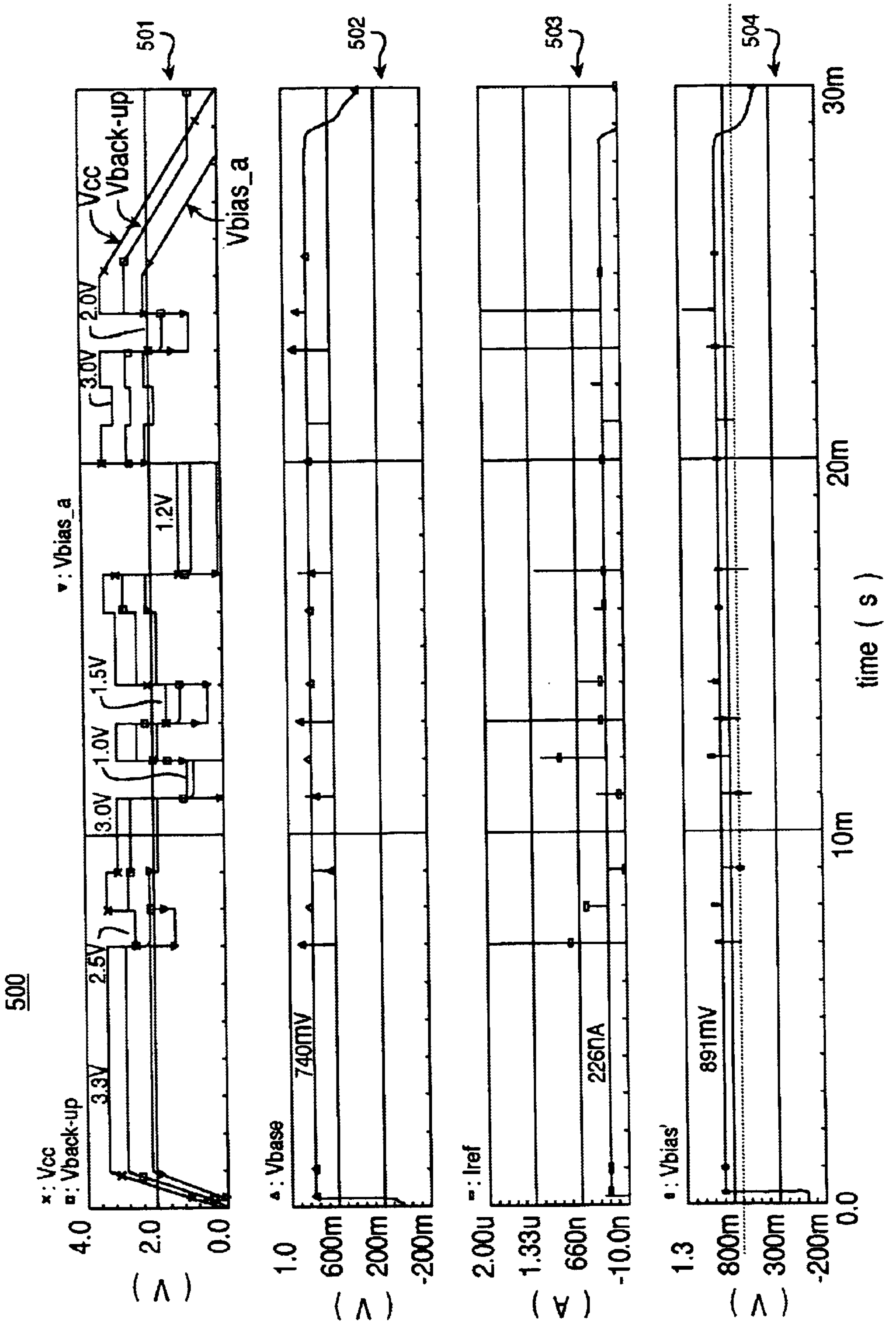
FIG. 5 shows a diagram depicting the operation of a startup system in accordance with an alternative embodiment of the present invention in the presence transient drops in the power supply voltage.

FIG. 5 shows a diagram 500 depicting the operation of a startup system 100 in accordance with an alternative embodiment of the present invention in the presence transient drops in the power supply voltage. FIG. 5 shows a case where the source of transistor N6 is connected to ground. In a similar manner as FIG. 4, FIG. 5 shows four graphs 501-504 depicting the behavior of the signals Vcc, Vback-up, Vbias_a, Vbase, Iref, and Vbias, as shown.

It be noted that the startup circuit embodiments in accordance with the present invention generate a startup current at a lower supply voltage under all situations in comparison to prior art conventional startup circuits. In addition, the startup circuit embodiments in accordance with the present invention have the advantage of a soft startup and no initial overshoot in reference current. This attribute holds true in cases, such as, for example: where Vcc increases from power off at a rate of 1V/200 μs at 25° C., 125° C., −40° C., and the like; where Vcc increases at a rate of 1V/2 ms at 25° C., 125° C., −40° C., and the like; where Vcc increases at a rate of 1V/1 μs at 25° C., 125° C. −40° C., and the like, and where Vcc increases at a rate of 1V/1 s at 25° C., 125° C., −40° C., and the like. In each of these cases, a startup circuit in accordance with embodiments of the present invention generates a startup current at a lower supply voltage.

Thus, start circuit embodiments in accordance with the present invention provides advantages including: generating startup currents at very low power supply, which is important for low voltage applications; keeping a current reference alive during Vcc transients for fast recover and operation by generating a restartup current when power supply drops transiently and significantly (e.g., down below 1V), which is essential for providing correct bias voltage and current to related analogy circuits such as comparator, oscillator etc.; generating a soft startup with no initial overshot in reference current; and not consuming static power.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A startup circuit for producing a startup current for an analog integrated circuit device, comprising:

a first portion including a diode component and a capacitance component, the first portion configured to function as a power supply backup and generate a backup point voltage; and a second portion including a current mirror component and a feedback component, the second portion configured to generate a startup current using the backup point voltage, such that the startup current is provided based on the backup point voltage as a power supply voltage.

2. The startup circuit of claim 1, wherein the backup point voltage is generated at a node between the diode component coupled to the power supply voltage and the capacitance component coupled to ground.

3. The startup circuit of claim 1, wherein the diode component of the first portion comprises a diode connected PNP transistor.

4. The startup circuit of claim 1, wherein the capacitance component of the first portion comprises a capacitor configured to eliminate static current.

5. The startup circuit of claim 1, wherein the startup current is provided by the current mirror, the current mirror comprising a first and second transistor coupled to the feedback component.

6. The startup circuit of claim 1, wherein the feedback component includes a first and second transistor coupled to form a positive feedback network with respect to the backup point voltage.

7. The startup circuit of claim 1, wherein the startup current is generated for an analog integrated circuit device, and is provided based on the backup point voltage as the power supply voltage increases from a power off or transient.

8. A system for producing a startup current for an integrated circuit device, comprising:

a bandgap reference circuit generating a reference current or voltage;

a startup circuit coupled to the bandgap reference circuit and to provide a startup current to the bandgap reference circuit;

wherein the startup circuit includes a first portion comprising a diode component and a capacitance component, the first portion configured to function as a power supply backup and generate a backup point voltage; and wherein the startup circuit includes a second portion comprising a current mirror component and a feedback component, the second portion configured to generate a startup current using the backup point voltage, such that the startup current is provided based on the backup point voltage as a power supply voltage increases from a power off or a transient.

9. The system of claim 8, wherein the startup circuit is configured to maintain stability of the startup current during a transient in the power supply voltage.

10. The system of claim 8, wherein the startup circuit is configured to prevent an overshoot of the startup current during a startup.

11. The system of claim 8, wherein the startup circuit is configured for a minimal static power consumption.

12. The startup circuit of claim 8, wherein the backup point voltage is generated at a node between the diode component coupled to the power supply voltage and the capacitance component coupled to ground.

13. The startup circuit of claim 8, wherein the diode component of the first portion comprises a diode connected PNP transistor.

14. The startup circuit of claim 8, wherein the capacitance component of the first portion comprises a capacitor configured to eliminate static current.

15. The startup circuit of claim 8, wherein the startup current is provided by the current mirror, the current mirror comprising a first and second transistor coupled to the feedback component.

16. The startup circuit of claim 8, wherein the feedback component includes a first and second transistor coupled to form a positive feedback network with respect to the backup point voltage.

17. The startup circuit of claim 8, wherein the startup current is generated for an analog integrated circuit device.

18. A system for producing a startup current for an integrated circuit device, comprising:

means for generating a bandgap reference current or voltage;

means for generating a startup current, the startup current coupled to the bandgap reference current or voltage generating means;

wherein the startup current generating means includes a first portion comprising a diode component and a capacitance component, the first portion configured to function as a power supply backup and generate a backup point voltage; and wherein the startup current generating means includes a second portion comprising a current mirror component and a feedback component, the second portion configured to generate a startup current using the backup point voltage, such that the startup current is provided based on the backup point voltage as a power supply voltage increases from a power off or a transient.

19. The system of claim 18, wherein the startup current generating means is configured to maintain stability of the startup current during a transient in the power supply voltage.

20. The system of claim 18, wherein the startup current generating means is configured to prevent an overshoot of the startup current during a startup.

21. The system of claim 18, wherein the startup current generating means is configured for a minimal static power consumption.

22. The startup circuit of claim 18, wherein the backup point voltage is generated at a node between the diode component coupled to the power supply voltage and the capacitance component coupled to ground.

* * * * *